(12) United States Patent
Park et al.

(45) Date of Patent: Sep. 9, 2014
(10) Patent No.: US 8,830,729 B2

(54) RESISTIVE MEMORY APPARATUS

(75) Inventors: Chul Hyun Park, Icheon-si (KR); Taek Sang Song, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 160 days.

(21) Appl. No.: 13/602,146

(22) Filed: Sep. 1, 2012

(65) Prior Publication Data
US 2013/0155755 A1 Jun. 20, 2013

(30) Foreign Application Priority Data
Dec. 16, 2011 (KR) .................. 10-2011-0136548

(51) Int. Cl.
*G11C 11/00* (2006.01)
(52) U.S. Cl.
USPC ............................................. 365/148
(58) Field of Classification Search
CPC .................................... G11C 13/004
USPC ............................................. 365/148
See application file for complete search history.

(56) References Cited

U.S. PATENT DOCUMENTS

| 8,503,220 | B2 * | 8/2013 | Kim et al. ................ 365/148 |
| 2011/0116320 | A1 | 5/2011 | Zhang |
| 2011/0261615 | A1 * | 10/2011 | Choi et al. ................ 365/163 |
| 2011/0286271 | A1 * | 11/2011 | Chen ................ 365/185.09 |
| 2012/0069628 | A1 * | 3/2012 | Ito ................ 365/148 |

* cited by examiner

*Primary Examiner* — Hoai V Ho
*Assistant Examiner* — Min Huang
(74) *Attorney, Agent, or Firm* — William Park & Associates Patent Ltd.

(57) ABSTRACT

A resistive memory apparatus includes a sensing voltage generation unit and a memory cell. The sensing voltage generation unit configured to drive a sensing node to a voltage with a predetermined level in response to a reference voltage and a voltage of the sensing node. The memory cell is connected with the sensing node and configured to change a magnitude of current flowing through the sensing node according to a resistance value thereof.

8 Claims, 9 Drawing Sheets

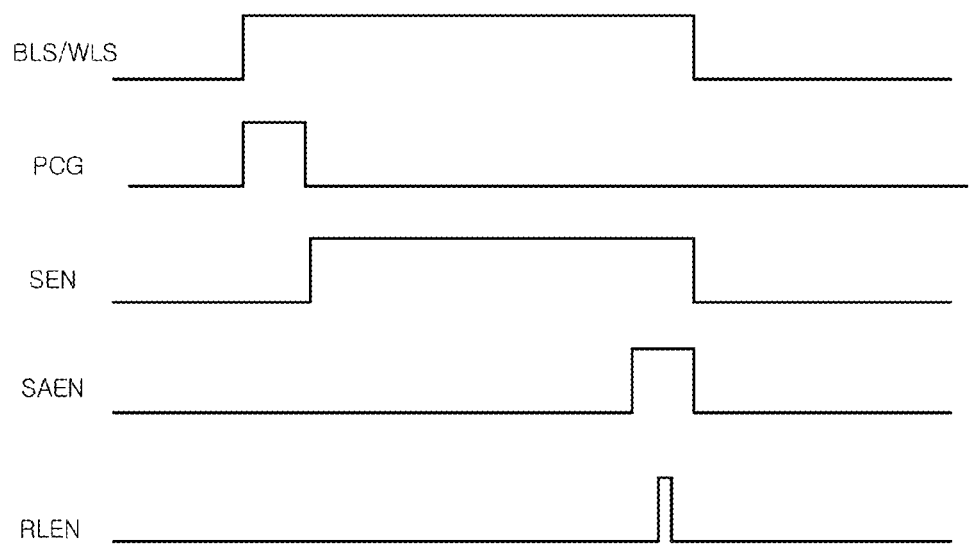

RESISTIVE MEMORY APPARATUS

CROSS-REFERENCES TO RELATED APPLICATION

The present application claims priority under 35 U.S.C. §119(a) to Korean application number 10-2011-0136548, filed on Dec. 16, 2011, in the Korean Intellectual Property Office, which is incorporated herein by reference in its entirety.

BACKGROUND

1. Technical Field

The present invention generally relates to a semiconductor apparatus, and more particularly, to a semiconductor apparatus which includes a resistive memory cell.

2. Related Art

A conventional DRAM includes a memory cell constituted by a capacitor, and data is stored by charging or discharging charges to and from the memory cell. However, since the capacitor has leakage current due to the characteristic thereof, the DRAM has a disadvantage in that it is a volatile memory. In order to overcome the disadvantage, memories which are nonvolatile and do not need the retention of data have been developed. In particular, attempts have been made to realize nonvolatility by modifying the structure of a memory cell. One of these attempts is a resistive memory apparatus which includes a resistive memory cell.

FIG. 1 is a view schematically showing the configuration of a conventional resistive memory apparatus. In FIG. 1, a conventional resistive memory apparatus includes a memory cell 11, first to fourth transistors N1, N2, N3, and N4, and a ground voltage Vss. The memory cell 11 is formed of a resistive substance of which resistance value changes according to a temperature or current, and has different resistance values according to the data stored therein.

The first transistor N1 supplies sensing current to sense the data stored in the memory cell 11. The first transistor N1 receives a bias voltage VB and applies a power supply voltage VPPSA to a sensing node SAI. The second transistor N2 is turned on in response to a clamping signal VCLAMP and serves to control the voltage applied to the memory cell 11 not to exceed a threshold. The third transistor N3 is turned on in response to a bit line select signal BLS and selects a bit line to which data access is to be implemented. The is fourth transistor N4 is turned on in response to a word line select signal WLS, and selects a word line to which data access is to be implemented.

The conventional resistive memory apparatus senses the data stored in the memory cell 11 by changing the voltage of the sensing node SAI. The first transistor N1 is turned when the bias voltage VB is applied, and is configured to supply a predetermined amount of current to the sensing node SAI. The current flows through the memory cell 11. Accordingly, the voltage level of the sensing node SAI changes according to the resistance value of the memory cell 11. That is to say, when the resistance value of the memory cell 11 is large, the voltage of the sensing node SAI has a high level, and when the resistance value of the memory cell 11 is small, the voltage of the sensing node SAI has a low level. In this way, in the conventional resistive memory apparatus, the predetermined amount of current is supplied to the sensing node SAI, and the data stored in the memory cell 11 is sensed through a change in the voltage level of the sensing node SAI according to the resistance value of the memory cell 11.

Further, in order to reliably sense a change in the voltage level of the sensing node SAI according to the resistance value of the memory cell 11, a boosting voltage VPPSA is used as the power supply voltage. In general, the boosting voltage VPPSA may be generated to a voltage with a level higher than the level of an external voltage, through a pumping circuit.

SUMMARY

A resistive memory apparatus which can efficiently perform data sensing by sensing current changing according to the data stored in a memory cell is described herein.

In an embodiment, a resistive memory apparatus includes: a sensing voltage generation unit configured to drive a sensing node to a voltage with a predetermined level in response to a reference voltage and a voltage of the sensing node; and a memory cell connected with the sensing node and configured to change a magnitude of current flowing through the sensing node according to a resistance value thereof.

In an embodiment, a resistive memory apparatus includes: a comparator configured to compare a reference voltage and a voltage of a sensing node and generate a comparison signal; a driver section configured to receive the comparison signal and provide a voltage with a predetermined level to the sensing node; a memory cell connected with the sensing node and configured to change a magnitude of current flowing through the sensing node according to a resistance value thereof; and a current copy unit configured to receive the comparison signal and copy sensing current.

In an embodiment, a resistive memory apparatus includes: a sensing voltage generation unit configured to drive a sensing node to a voltage with a predetermined level in response to a reference voltage and a voltage of the sensing node; a memory cell connected is with the sensing node and configured to change a magnitude of current flowing through the sensing node according to a resistance value thereof; and a current latch unit configured to compare copied current generated by copying sensing current with reference current generated by a reference voltage, and generate a data output signal.

In an embodiment, a resistive memory apparatus includes: a sensing voltage generation unit configured to drive a sensing node to a voltage with a predetermined level in response to a reference voltage and a voltage of the sensing node; a memory cell connected with the sensing node and configured to generate sensing current according to a resistance value thereof; and an output signal generation unit configured to sense a magnitude of copied current generated by copying the sensing current, and generate a data output signal.

BRIEF DESCRIPTION OF THE DRAWINGS

Features, aspects, and embodiments are described in conjunction with the attached drawings, in which:

FIG. 10 is a timing diagram explaining operations of the resistive memory apparatus in accordance with an embodiment.

DETAILED DESCRIPTION

Figure 1:
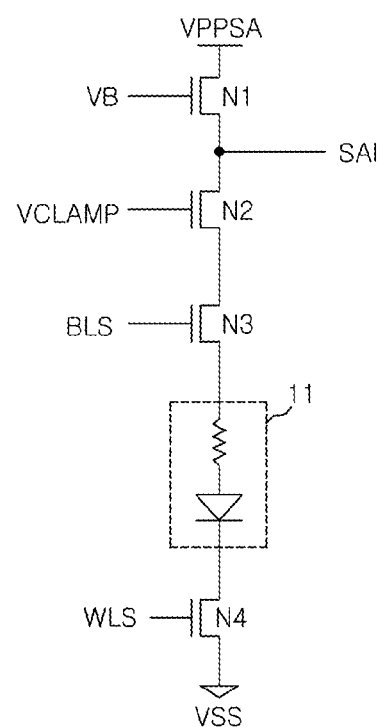
FIG. 1 is a view schematically showing the configuration of a conventional resistive memory apparatus.

Hereinafter, a resistive memory apparatus according to the present invention will be described below with reference to the accompanying drawings through various embodiments. The same reference numerals or the same reference designators may denote the same elements throughout the specification.

Figure 2:
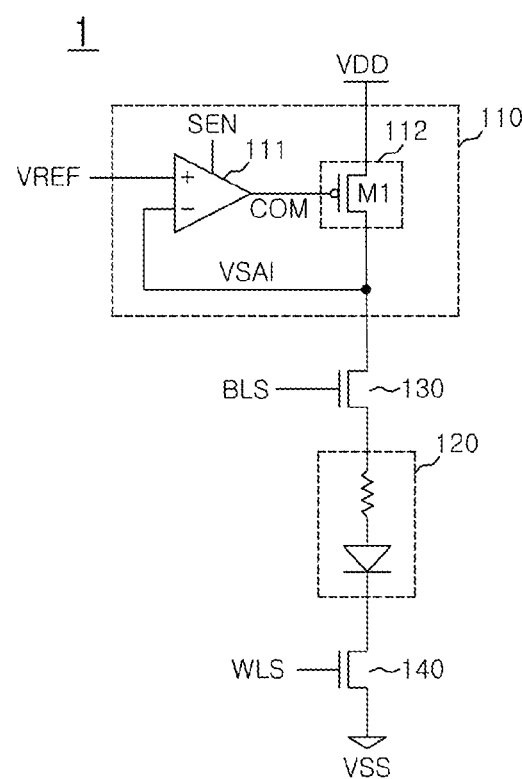
FIG. 2 is a view schematically showing the configuration of a resistive memory apparatus in accordance with an embodiment.

FIG. 2 is a view schematically showing the configuration of a resistive memory apparatus in accordance with an embodiment. In FIG. 2, a resistive memory apparatus 1 may include a sensing is voltage generation unit 110, and a memory cell 120. The sensing voltage generation unit 110 may supply a voltage with a predetermined level to a sensing node VSAI in response to a reference voltage VREF and the voltage of the sensing node VSAI. The memory cell 120 may be connected with the sensing node VSAI. The memory cell 120 may receive the voltage of the sensing node VSAI, and may change an amount of current which flows through the sensing node VSAI, according to the resistance value of the memory cell 120. The amount of current which flows through the sensing node VSAI when the resistance value of the memory cell 120 is small is larger than the amount of current which flows through the sensing node VSAI when the resistance value of the memory cell 120 is large.

The conventional resistive memory apparatus shown in FIG. 1 has a structure in which the amount of current flowing through the sensing node VSAI may be fixed, the voltage level of the sensing node VSAI may be changed according to the resistance value of the memory cell 11, and data may be sensed by sensing a change in the voltage level. Conversely, in an embodiment shown in FIG. 2, the resistive memory apparatus 1 has a structure in which the sensing node VSAI may be fixed to the predetermined voltage level, the amount of current flowing through the sensing node VSAI may be changed according to the resistance value of the memory cell 120, and data may be sensed by sensing a change in current.

The resistive memory apparatus 1 in accordance with an embodiment which may sense a change in current has various advantages. First, since the resistive memory apparatus 1 may sense a change in current, it is not necessary to supply a wide voltage range to the memory cell 120, and accordingly, it is not necessary to supply a voltage with a high level. In the conventional resistive memory apparatus, the voltage of the sensing node VSAI may be changed according to the resistance value of the memory cell 120, and a threshold or a reference for allowing a voltage change to be sensed is needed. Therefore, in order to discriminate the high resistance state and the low resistance state of the memory cell, a voltage with a wide range should be supplied. Accordingly, in the conventional resistive memory apparatus, it may be seen that the boosting voltage VPPSA is supplied by pumping the power supply voltage as in FIG. 1. However, in the resistive memory apparatus 1 in accordance with an embodiment, since the threshold voltage as described above is not needed, it is not necessary to generate a voltage with a wide range, and it is sufficient to apply an external voltage VDD as a power supply voltage as shown in FIG. 2. Accordingly, current consumption may be reduced due to nonuse of the boosting voltage, and a circuit for generating a high voltage may be removed.

Also, since a current change may be sensed, a time for sensing the data stored in the memory cell 120 is shortened. In other words, quick data sensing is made possible. Further, as an improved structure in which the voltage with the predetermined level is supplied to the sensing node VSAI is adopted, an unnecessary is element such as a clamping switch as in the conventional art may be removed.

In FIG. 2, the resistive memory apparatus 1 further may include a column switch 130 and/or a row switch 140. The column switch 130 may connect the memory cell 120 and the sensing node VSAI in response to a bit line select signal BLS. The row switch 140 may be connected with a word line and forms a current path which passes through the memory cell 120. Namely, the row switch 140 may connect the memory cell 120 with the terminal of a ground voltage VSS in response to a word line select signal WLS.

In FIG. 2, the sensing voltage generation unit 110 may include a comparator 111 and a driver section 112. The comparator 111 may compare the level of the reference voltage VREF and the voltage level of the sensing node VSAI and may generate a comparison signal COM. For example, the reference voltage VREF may have one half level of the power supply voltage VDD. Additionally, the sensing voltage generation unit 110 may be enabled in response to a sensing enable signal SEN. The sensing enable signal SEN may be generated from a read command. The read command may include all read commands for data output, such as a normal read command and a verification read command. The driver section 112 may supply the voltage with the predetermined level to the sensing node VSAI in response to the comparison signal COM. The driver section 112 may include a first MOS transistor M1. In FIG. 2, while the first MOS transistor M1 is exemplified as a PMOS transistor, it is to be noted that the present invention is not limited to such. The first MOS transistor M1 has a gate which may receive the comparison signal COM, a source which is applied with the power supply voltage VDD and a drain which may be connected with the sensing node VSAI.

The comparator 111 may gradually lower the level of the comparison signal COM until the voltage level of the sensing node VSAI becomes the same with the level of the reference voltage VREF. The driver section 112 gradually forcefully drives the sensing node VSAI to the level of the power supply voltage VDD in response to the comparison signal COM. The driver section 112 may increase the magnitude of the voltage supplied to the sensing node VSAI according to the comparison signal COM which is lowered. If the level of the reference voltage VREF and the voltage level of the sensing node VSAI become the same with each other, the driver section 112 may fix the voltage level of the sensing node VSAI. The memory cell 120 may receive the voltage with the predetermined level and may change the amount of current flowing through the sensing node VSAI according to the resistance value thereof.

The change in the amount of current flowing through the sensing node VSAI may change the voltage level of the gate of the first MOS transistor M1, that is, the level of the comparison signal COM. Accordingly, the sensing voltage generation unit 110 may supply the voltage with the predetermined level to the sensing node VSAI, and the magnitude of the current flowing through the sensing is node VSAI may be changed according to the resistance value of the memory cell 120.

Figure 3:
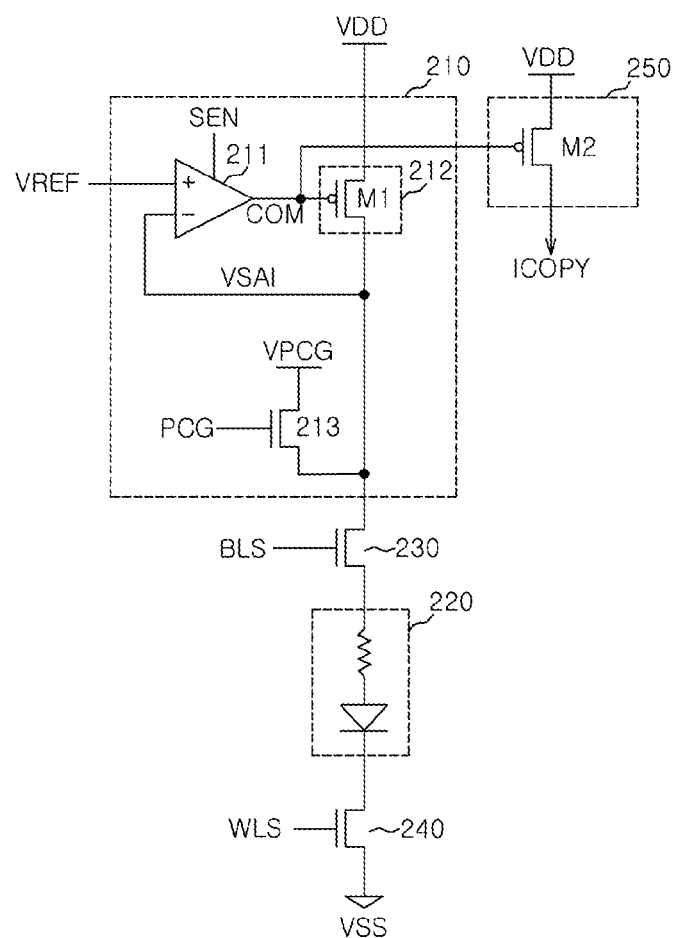
FIG. 3 is a view schematically showing the configuration of a resistive memory apparatus in accordance with an embodiment.

FIG. 3 is a view schematically showing the configuration of a resistive memory apparatus 2 in accordance with an embodiment. In FIG. 3, the configurations of a column switch 230, a row switch 240, and a memory cell 220 are the same as those of FIG. 2.

In FIG. 3, a sensing voltage generation unit 210 further may include a precharge section 213 in addition to a comparator 211 and a driver section 212. The precharge section 213 may supply a precharge voltage VPCG to a sensing node VSAI in response to a precharge signal PCG. The precharge voltage VPCG may be any voltage with a level the same as or lower than the level of a reference voltage VREF. The precharge section 213 may supply the precharge voltage VPCG to the sensing node VSAI when the precharge signal PCG is enabled, and may raise the voltage level of the sensing node VSAI. If the sensing node VSAI has the level of the precharge voltage VPCG by the precharge section 213 before the comparator 211 performs the operation of comparing the level of the reference voltage VREF and the voltage level of the sensing node VSAI, it is possible to support a more quick sensing operation. That is to say, because the comparator 211 may compare the voltage of the sensing node VSAI raised by the level of the precharge voltage VPCG with the reference voltage VREF, a time for the voltage of the sensing node VSAI to become the same with the level of the reference voltage VREF is shortened, and timing for the driver section 212 to supply a is voltage with a predetermined level to the sensing node VSAI becomes earlier.

In FIG. 3, the resistive memory apparatus 2 further may include a current copy unit 250. The current copy unit 250 may generate copied current ICOPY which has substantially the same magnitude as the magnitude of the current flowing through the sensing node VSAI, for smooth data sensing. The current copy unit 250 may generate the copied current ICOPY in response to a comparison signal COM as the output of the comparator 211 of the sensing voltage generation unit 210. The voltage with the predetermined level may be supplied to the sensing node VSAI by the sensing voltage generation unit 210, and when the magnitude of current flowing through the sensing node VSAI is changed according to the resistance value of the memory cell 220, the current copy unit 250 may generate the copied current ICOPY with substantially the same magnitude as the magnitude of current flowing through the sensing node VSAI.

The current copy unit 250 may include a second MOS transistor M2. In FIG. 3, the second MOS transistor M2 is exemplified as a PMOS transistor. The second MOS transistor M2 has a gate which may receive the comparison signal COM, a source which may receive a power supply voltage VDD, and a drain which outputs the copied current ICOPY. The second MOS transistor M2 may be substantially the same transistor as the first MOS transistor M1 which constitutes the driver section 212 of the sensing voltage generation is unit 210. In other words, since the first and second MOS transistors M1 and M2 response to the comparison signal COM, only when the first and second MOS transistors M1 and M2 are constituted by transistors with substantially the same driving force, the magnitude of current flowing through the sensing node VSAI and the magnitude of the copied current ICOPY may be made the same with each other.

The comparators 111 and 211 shown in FIGS. 2 and 3 may be constituted by a differential amplifier generally known in the art. The differential amplifier may be configured to operate in response to a sensing enable signal SEN, compare the voltage level of the sensing node VSAI and the level of the reference voltage VREF, and generate the comparison signal COM.

Figure 4:
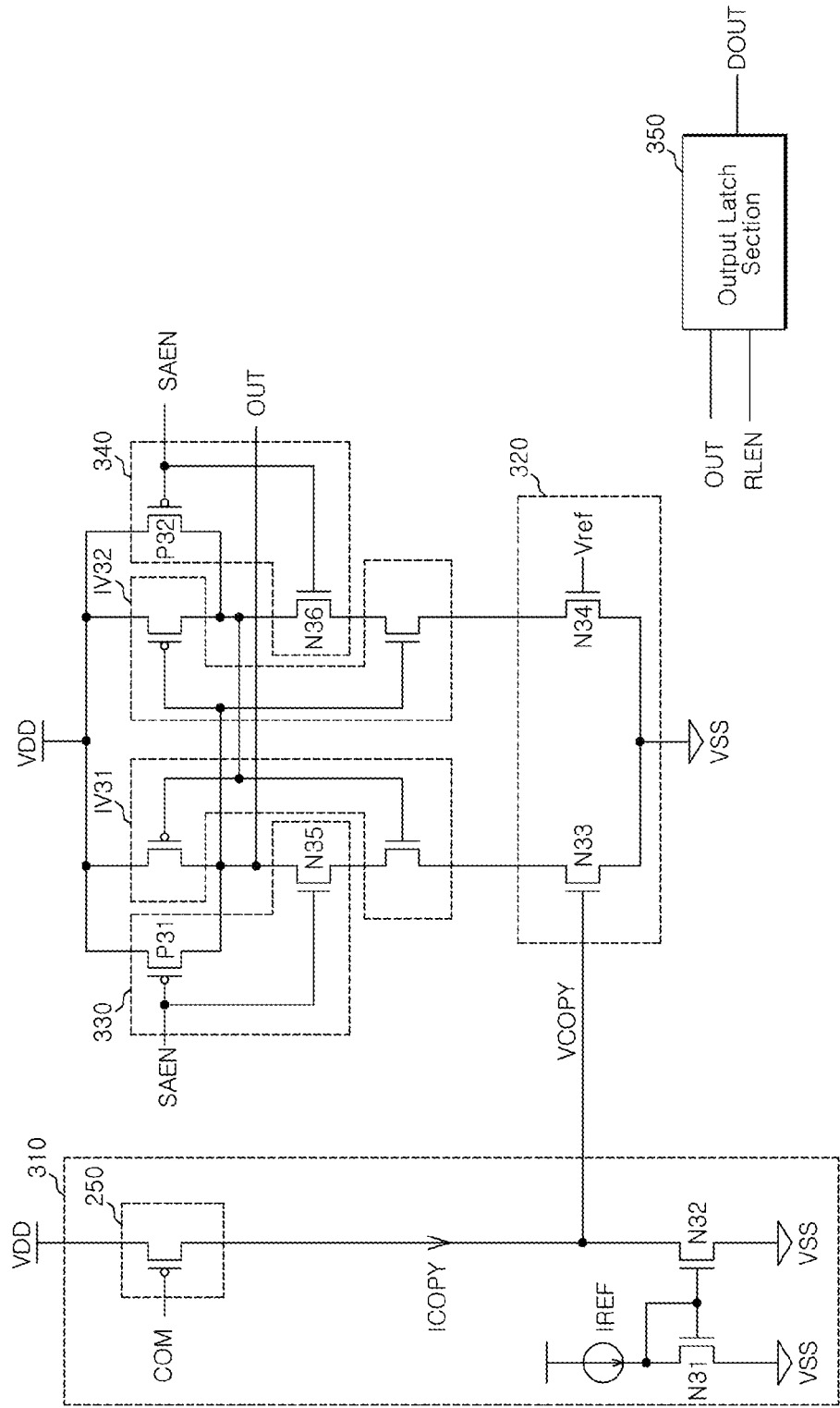
FIG. 4 is a view showing the configuration of an is embodiment of a current sensing unit for sensing the magnitude of copied current which is generated from the resistive memory apparatus of FIG. 3.

FIG. 4 is a view showing the configuration of an embodiment of a current sensing unit for sensing the magnitude of copied current which may be generated from the resistive memory apparatus of FIG. 3. In FIG. 4, the current sensing unit may include a copied voltage generating section 310, a voltage comparing section 320, a voltage latch section, and an output latch section 350. The copied voltage generating section 310 may be configured to receive the copied current ICOPY generated from the current copy unit 250 and generate a copied voltage VCOPY according to the magnitude of the copied current ICOPY. The copied voltage generating section 310 may include a reference current source IREF, and first and second NMOS transistors N31 and N32. The first and second NMOS transistors N31 and N32 may form a current mirror structure. Accordingly, the magnitude of current flowing through the first NMOS transistor N31 and the magnitude of current flowing through the second NMOS transistor N32 may be equal to each other. The copied voltage VCOPY with a relatively high level may be generated in the case where the magnitude of the copied current ICOPY is larger than the magnitude of current flowing through the second NMOS transistor N32, when compared to the case where the magnitude of the copied current ICOPY is smaller than the magnitude of current flowing through the second NMOS transistor N32.

The voltage comparing section 320 may be configured to compare the magnitudes of the copied voltage VCOPY and the reference voltage VREF. The voltage latch section may be configured to generate an output signal OUT according to a comparison result of the voltage comparing section 320. The voltage comparing section 320 may include third and fourth NMOS transistors N33 and N34. The voltage latch section may include first and second inverters IV31 and IV32. The third NMOS transistor N33 has a gate which may receive the copied current ICOPY and a source which may be connected with a ground voltage VSS. The fourth NMOS transistor N34 has a gate which may receive the reference voltage VREF and a source which may be connected with the ground voltage VSS. The first inverter IV31 has a first power supply terminal which may receive the power supply voltage VDD and a second power supply terminal which may be connected with the drain of the third NMOS transistor N33. The output signal OUT may be generated from the output terminal of the first inverter IV31. The second inverter IV32 has a first power supply terminal which may receive the power supply voltage VDD and a second power supply terminal which may be connected with the drain of the fourth NMOS transistor N34. The input terminal of the second inverter IV32 may be connected with the output terminal of the first inverter IV31, and the output terminal of the second inverter IV32 may be connected with the input terminal of the first inverter IV31.

The output latch section 350 may be configured to receive the output signal OUT of the voltage latch section and a read enable signal RLEN and output a data output signal DOUT.

The current sensing unit further may include enable section 330 and 340. The enable sections 330 and 340 are configured to operate the voltage comparing section 320 and the voltage latch section in response to a comparison enable signal SAEN. Also, the enable sections 330 and 340 may be configured to precharge the output terminals of the first and second inverters IV31 and IV32 in response to the comparison enable signal SAEN. The enable sections 330 and 340 may include first and second PMOS transistors P31 and P32 and fifth and sixth NMOS transistors N35 and N36. The first and second PMOS transistors P31 and P32 may receive the comparison enable signal SAEN through the gates thereof and connect the first power supply terminals and the output terminals of the first and second inverters IV31 and IV32. Accordingly, when receiving the comparison enable signal SAEN which may be disabled, the first and second PMOS transistors P31 and P32 precharge the output terminal of the first inverter IV31 and the output terminal of the second inverter IV32 to the level of the power supply voltage VDD. The fifth NMOS transistor N35 has a gate which may receive the comparison enable signal SAEN, and may be connected between the second power supply terminal of the first inverter IV31 and the drain of the third NMOS transistor N33. The sixth NMOS transistor N36 has a gate which may receive the comparison enable signal SAEN, and may be connected between the second power supply terminal of the second inverter IV32 and the drain of the fourth NMOS transistor N34. When receiving the comparison enable signal SAEN which is enabled, the fifth and sixth NMOS transistors N35 and N36 connect the power supply terminals of the first and second inverters IV31 and IV32 with the drains of the third and fourth NMOS transistors N33 and N34.

In the state in which the comparison enable signal SAEN is disabled, the output terminals of the first and second inverters IV31 and IV32 may be precharged to a high level. If the comparison enable signal SAEN is enabled, the voltage comparing section 320 may compare the magnitudes of the copied voltage VCOPY and the reference voltage VREF. In the case where the magnitude of the copied voltage VCOPY is larger than the magnitude of the reference voltage VREF, an amount of current sunk through the third NMOS transistor N33 is more than an amount of current sunk through the fourth NMOS transistor N34. Also, since the input terminal of the first inverter IV31 may be connected with the output terminal of the second inverter IV32 which may be precharged to the high level, the output signal OUT with a low level may be generated.

Conversely, in the case where the magnitude of the copied voltage VCOPY is smaller than the magnitude of the reference voltage VREF, an amount of current sunk through the fourth NMOS transistor N34 may be more than an amount of current sunk through the third NMOS transistor N33. Therefore, the output terminal of the second inverter IV32 may become a low level, and since the input terminal of the first inverter IV31 may be connected with the output terminal of the second inverter IV32, the output signal OUT with a high level may be generated.

When the read enable signal RLEN is enabled, the output latch section 350 may generate the data output signal DOUT according to the level of the output signal OUT. The output latch section 350 may receive, for example, an inverted signal OUTB (not shown) of the output signal OUT. When the read enable signal RLEN is enabled, the output latch section 350 may generate the data output signal DOUT of a high level when the inverted signal OUTB of the output signal OUT has the high level and may generate the data output signal DOUT of a low level when the inverted signal OUTB of the output signal OUT has the low level.

Figure 5:
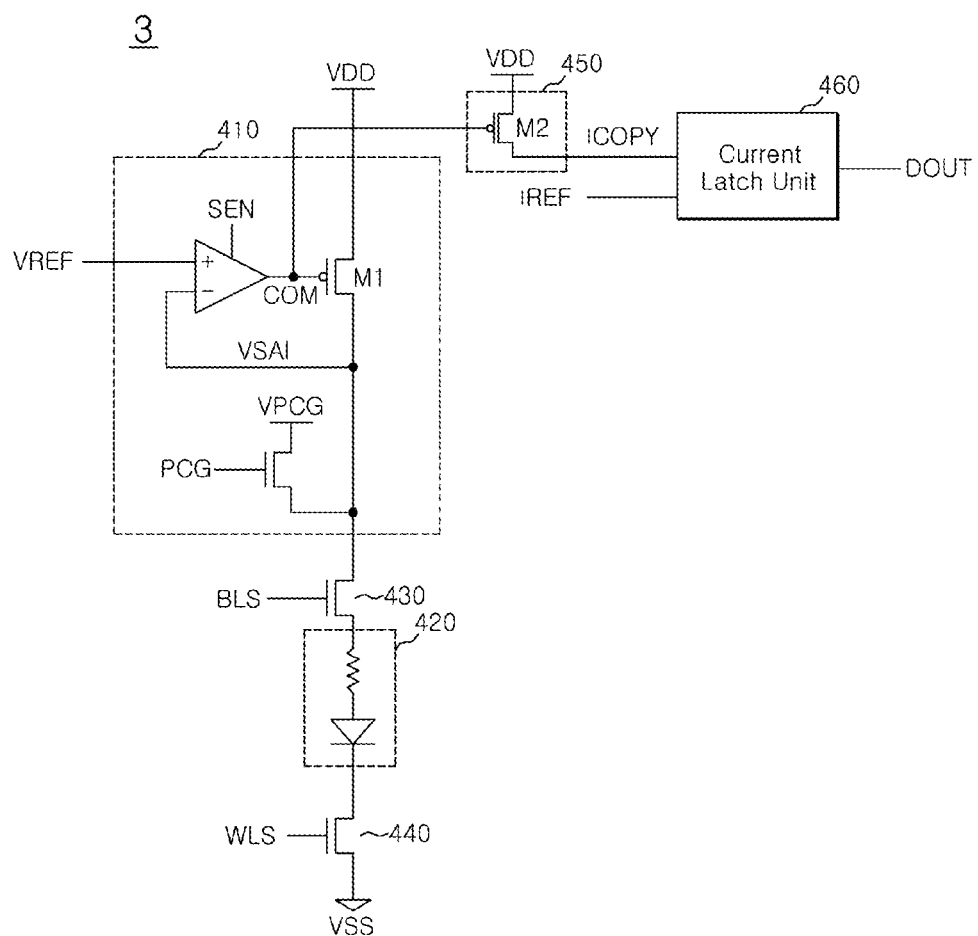
FIG. 5 is a view schematically showing the configuration of a resistive memory apparatus in accordance with an embodiment.

FIG. 5 is a view schematically showing the configuration of a resistive memory apparatus in accordance with an embodiment. In FIG. 5, a resistive memory apparatus 3 may include a sensing voltage generation unit 410, a memory cell 420, a current copy unit 450, and a current latch unit 460. The sensing voltage generation unit 410, the memory cell 420 and the current copy unit 450 are the same as in the embodiments of FIGS. 2 and 3. The current latch unit 460 may be configured to compare the magnitude of copied current ICOPY and the magnitude of reference current IREF. The current latch unit 460 may generate a data output signal DOUT by comparing the magnitude of the copied current ICOPY and the magnitude of the reference current IREF. The copied current ICOPY is current which has substantially the same magnitude as sensing current flowing through a sensing node VSAI, and the reference current IREF is current which is generated by a reference voltage VREF. The reference current IREF will be described later. The current latch unit 460 may compare the magnitude of the copied current ICOPY and the magnitude of the reference current IREF and may generate the data output signal DOUT which has different logic levels according to comparison results. For example, in the case where the magnitude of the copied current ICOPY is larger than the magnitude of the reference current IREF, the current latch unit 460 may generate the data output signal DOUT of a high level, and in the case where the magnitude of the copied current ICOPY is smaller than the magnitude of the reference current IREF, the current latch unit 460 may generate the data output signal DOUT of a low level.

In FIG. 5, like the resistive memory apparatus 2 of FIG. 3, the resistive memory apparatus 3 may further include a column switch 430 and/or a row switch 440.

Figure 6:
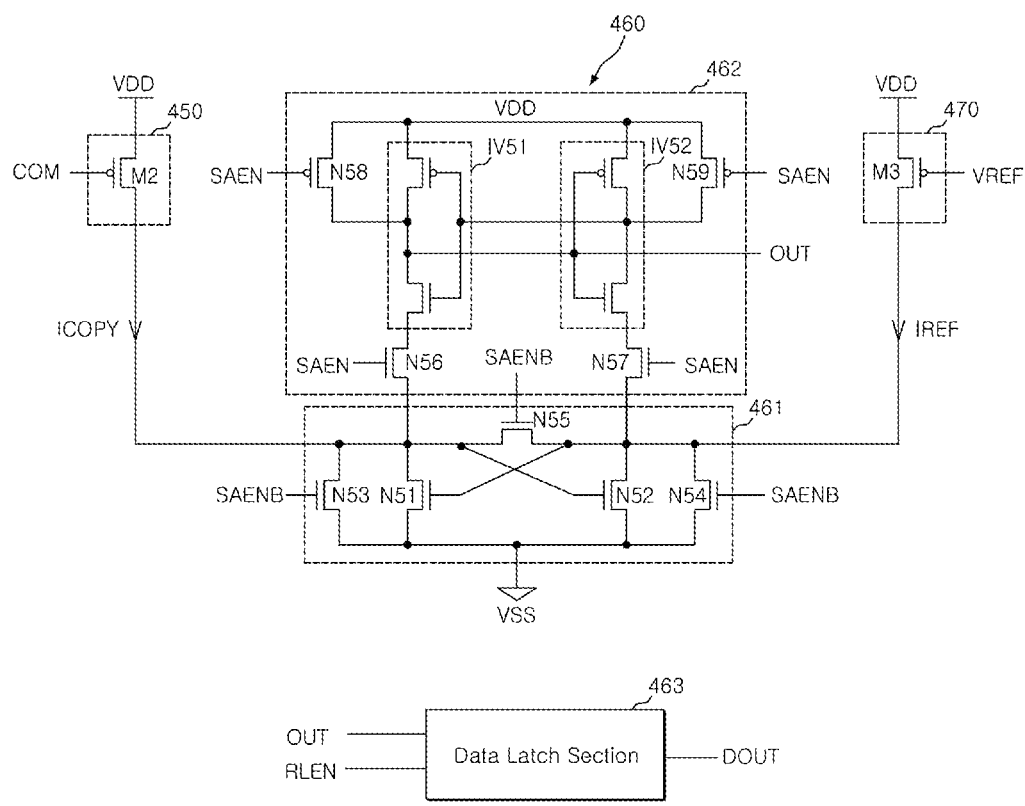
FIG. 6 is a view showing the configuration of the current latch unit of FIG. 5.

FIG. 6 shows the current latch unit 460 along with the current copy unit 450 and a reference current generation unit 470. While the current copy unit 450 and the reference current generation unit 470 are shown as components separate from the current latch unit 460 in FIGS. 5 and 6, it is to be noted that, in another embodiment the current latch unit 460 may be configured to include one or both of the current copy unit 450 and the reference current generation unit 470.

The reference current generation unit 470 may include a third MOS transistor M3. In FIG. 6, the reference current generation unit 470 is exemplified as a PMOS transistor. The third MOS transistor M3 has a gate which may receive the reference voltage VREF, a source which is applied with the power supply voltage VDD and a drain which outputs the reference current IREF. The third MOS transistor M3 may be substantially the same transistor as the first and second MOS transistors M1 and M2. In other words, the first to third MOS transistors M1, M2, and M3 may be constituted by transistors with substantially the same driving force and may change at the same rate the magnitudes of current generated according to the voltages applied to the gates.

The current latch unit 460 may include a current comparing section 461 and an output latch section 462. The current comparing section 461 may be configured to receive the copied current ICOPY and the reference current IREF and compare the magnitudes of the copied current ICOPY and the reference current IREF. The output is latch section 462 may be configured to generate an output signal OUT according to a comparison result of the current comparing section 461.

In FIG. 6, the current comparing section 461 may include first and second NMOS transistors N51 and N52. The first and second NMOS transistors N51 and N52 form a cross-coupled structure. The first NMOS transistor N51 has a gate which may receive the reference current IREF, a drain which may receive the copied current ICOPY and a source which may be connected with a ground voltage VSS. The second NMOS transistor N52 has a gate which may receive the copied current ICOPY, a drain which may receive the reference current IREF and a source which may be connected with the ground voltage VSS. Through this structure, the first and second NMOS transistors N51 and N52 are selectively turned on according to the magnitudes of the copied current ICOPY and the reference current IREF. The current comparing section 461 further may include precharge switches. The precharge switches include third to fifth NMOS transistors N53, N54, and N55. The third and fourth NMOS transistors N53 and N54 receive a precharge control signal through the gates thereof, and connect the drains of the first and second NMOS transistors N51 and N52 with the ground voltage VSS in response to the precharge control signal. The fifth NMOS transistor N55 has a gate which may receive the precharge control signal, and may connect the drains of the first and second NMOS transistors N51 and N52 with each other in response to the precharge control signal. Accordingly, the precharge switches cause the current comparing section 461 not to compare the magnitudes of the copied current ICOPY and the reference current IREF when a comparison enable signal SAEN is disabled. The precharge control signal may be generated from the comparison enable signal SAEN. The precharge control signal may be an inverted signal SAENB of the comparison enable signal SAEN. The comparison enable signal SAEN may be generated from a read command as aforementioned above.

The output latch section 462 may include first and second inverters IV51 and IV52. The first inverter IV51 has a first power supply terminal which may receive the power supply voltage VDD and a second power supply terminal which may be connected with the drain of the first NMOS transistor N51. The first inverter IV51 has an input terminal which may receive the output of the second inverter IV52 and an output terminal which may be connected with the power supply voltage VDD. The output of the first inverter IV51 is provided as the output signal OUT. The second inverter IV52 has a first power supply terminal which may receive the power supply voltage VDD and a second power supply terminal which may be connected with the drain of the second NMOS transistor N52. The second inverter IV52 has an input terminal which may receive the output of the first inverter IV51, and may output an output by inverting the level of the output of the first inverter IV51.

The output latch section 462 further may include enable switches. The enable switches may include sixth to ninth NMOS transistors N56, N57, N58, and N59. The sixth NMOS transistor N56 may receive the comparison enable signal SAEN through the gate thereof, and may connect the second power supply terminal of the first inverter IV51 and the drain of the first NMOS transistor N51 in response to the comparison enable signal SAEN. The seventh NMOS transistor N57 may receive the comparison enable signal SAEN through the gate thereof, and may connect the second power supply terminal of the second inverter IV52 and the drain of the second NMOS transistor N52 in response to the comparison enable signal SAEN. The eighth NMOS transistor N58 may receive the comparison enable signal SAEN through the gate thereof, and provides the power supply voltage VDD to the output terminal of the first inverter IV51 and the input terminal of the second inverter IV52 in response to the comparison enable signal SAEN. The ninth NMOS transistor N59 may receive the comparison enable signal SAEN through the gate thereof, and provides the power supply voltage VDD to the input terminal of the first inverter IV51 and the output terminal of the second inverter IV52 in response to the comparison enable signal SAEN.

The current latch unit 460 further may include a data latch section 463. The data latch section 463 may be configured to receive the output signal OUT of the output latch section 462 and a read enable signal RLEN. The data latch section 463 may provide the output signal OUT of the output latch section 462 as the data output signal DOUT when the read enable signal RLEN is enabled. The read enable signal RLEN may be generated from the read command is described above.

Operations of the current latch unit 460 will be described below. The current comparing section 461 may turn on the third and fifth NMOS transistors N53, N54, and N55 when the precharge control signal is enabled, and does not compare the magnitudes of the copied current ICOPY and the reference current IREF. Thereafter, if the comparison enable signal SAEN is enabled and the precharge control signal is disabled, the third to fifth NMOS transistors N53, N54 and N55 and the eighth and ninth NMOS transistors N58 and N59 may be turned off and the sixth and seventh NMOS transistors N56 and N57 may be turned on, and the magnitudes of the copied current ICOPY and the reference current IREF may be compared. In the case where the magnitude of the copied current ICOPY is larger than the magnitude of the reference current IREF, the second NMOS transistor N52 may be turned on and the first NMOS transistor N51 may be turned off. Accordingly, the second power supply terminal of the second inverter IV52 may receive the ground voltage VSS. Since the second power supply terminal of the first inverter IV51 does not receive the ground voltage VSS, the output latch section 462 may generate the output signal OUT of a high level. Thus, the data latch section 463 may latch the output of the output latch section 462 and generate the data output signal DOUT of a high level when the read enable signal RLEN is enabled. Conversely, in the case where the magnitude of the copied current ICOPY is smaller than the magnitude of the reference current IREF, the first NMOS transistor N51 may be is turned on and the second NMOS transistor N52 may be turned off. Accordingly, the first power supply terminal of the first inverter IV51 may receive the ground voltage VSS. Hence, the output latch section 462 may generate the output signal OUT of a low level. Thus, the data latch section 463 may latch the output signal OUT of the output latch section 462 and generate the data output signal DOUT of a low level when the read enable signal RLEN is enabled.

Figure 7:
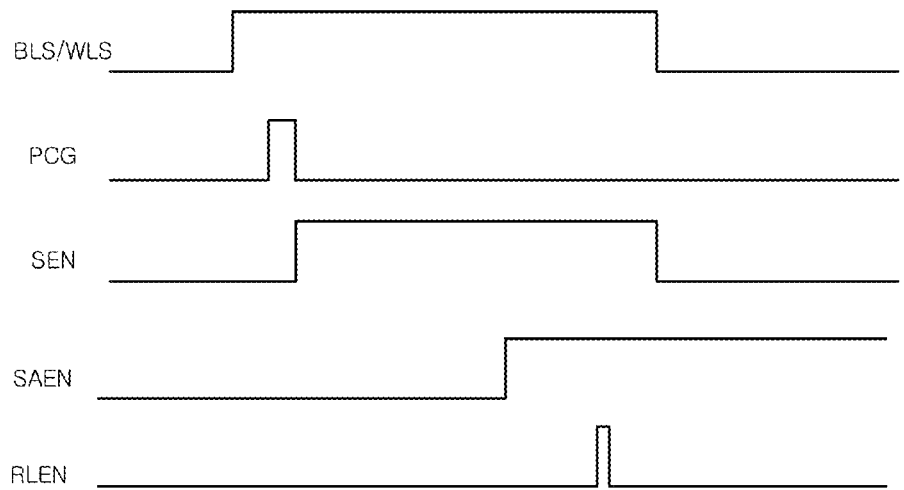
FIG. 7 is a timing diagram explaining operations of the resistive memory apparatus in accordance with an embodiment.

FIG. 7 is a timing diagram explaining operations of the resistive memory apparatus in accordance with an embodiment. Operations of the resistive memory apparatus 3 in accordance with the present embodiment of the present invention will be described with reference to FIGS. 5 to 7. First, in order to make an access to the data stored in a desired memory cell, a bit line select signal BLS and a word line select signal WLS are enabled. When the memory cell 420 is selected by the bit line select signal BLS and the word line select signal WLS, a sensing enable signal SEN is enabled from the read command to sense the data stored in the memory cell 420. The sensing voltage generation unit 410 may provide a predetermined voltage to the sensing node VSAI. As the predetermined voltage is provided to the sensing node VSAI, the magnitude of current flowing through the sensing node VSAI may be changed according to the resistance value of the memory cell 420 (that is, according to the value of the data stored in the memory cell 420). A change in the amount of current results in a change in the voltage level of a comparison signal COM, and the current copy unit 450 may generate is the copied current ICOPY in response to the change in the voltage level of the comparison signal COM. When the resistance of the memory cell 420 is large, the magnitude of the copied current ICOPY decreases, and when the resistance of the memory cell 420 is small, the magnitude of the copied current ICOPY increases. At this time, the current comparing section 461 does not compare the magnitudes of the copied current ICOPY and the reference current IREF in response to the disabled comparison enable signal SAEN. After the copied current ICOPY is sufficiently changed according to the resistance value of the memory cell 420, the comparison enable signal SAEN is enabled. The output latch section 462 may generate the output signal OUT of the high level or the low level according to the comparison result of the copied current ICOPY and the reference current IREF, and the data latch section 463 latches the output signal OUT of the output latch section 462 in response to the read enable signal RLEN and may output the data output signal DOUT of the high level or the low level.

Figure 8:
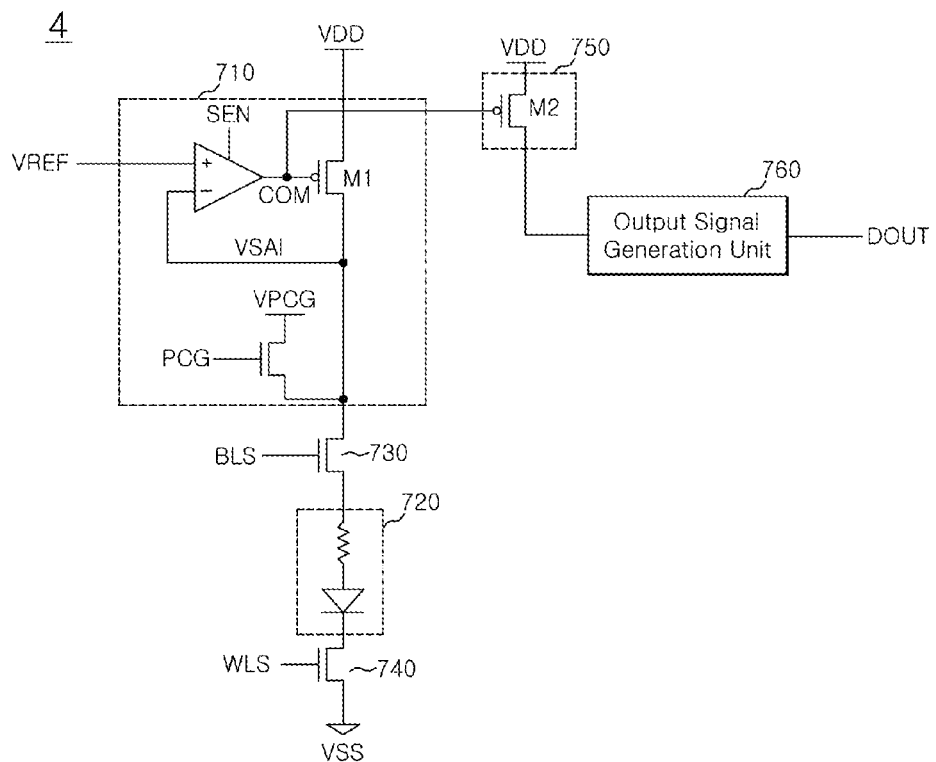
FIG. 8 is a view schematically showing the configuration of a resistive memory apparatus in accordance with an embodiment.

FIG. 8 is a view schematically showing the configuration of a resistive memory apparatus in accordance with an embodiment. In FIG. 8, a resistive memory apparatus 4 may include a sensing voltage generation unit 710, a memory cell 720, a column switch 730, a row switch 740, a current copy unit 750, and an output signal generation unit 760. The sensing voltage generation unit 710, the memory cell 720, the column switch 730 and the row switch 740 are the same as those of the resistive memory apparatus 3 of FIG. 5. The resistive memory apparatus 4 replaces the current latch unit 460 of the resistive memory apparatus 3 with the configuration of the output signal generation unit 760. The current copy unit 750 may be included in the output signal generation unit 760 or may be configured as a separate component of the resistive memory apparatus 4.

The output signal generation unit 760 may be configured to sense the magnitude of copied current ICOPY which has substantially the same magnitude as sensing current, and may generate a data output signal DOUT. It is as described above that the magnitude of the copied current ICOPY may be changed according to the resistance value of the memory cell 720. Accordingly, the output signal generation unit 760 may sense the magnitude of the copied current ICOPY and may generate the data output signal DOUT with a high level or a low level.

Figure 9A:
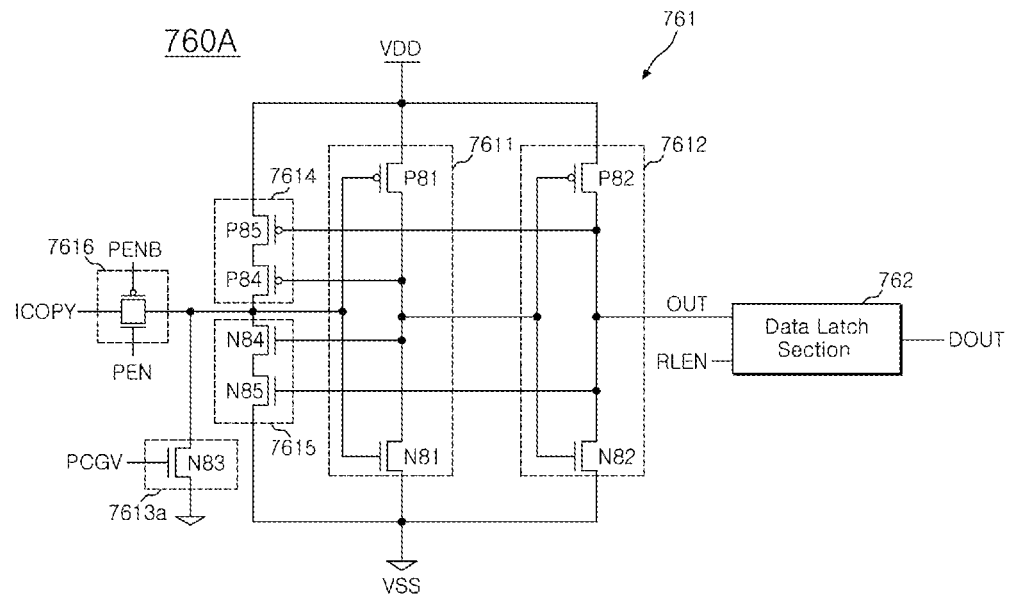
FIGS. 9A and 9B are views each showing the configuration of an embodiment of the output signal generation unit of FIG. 8.
Figure 9B:
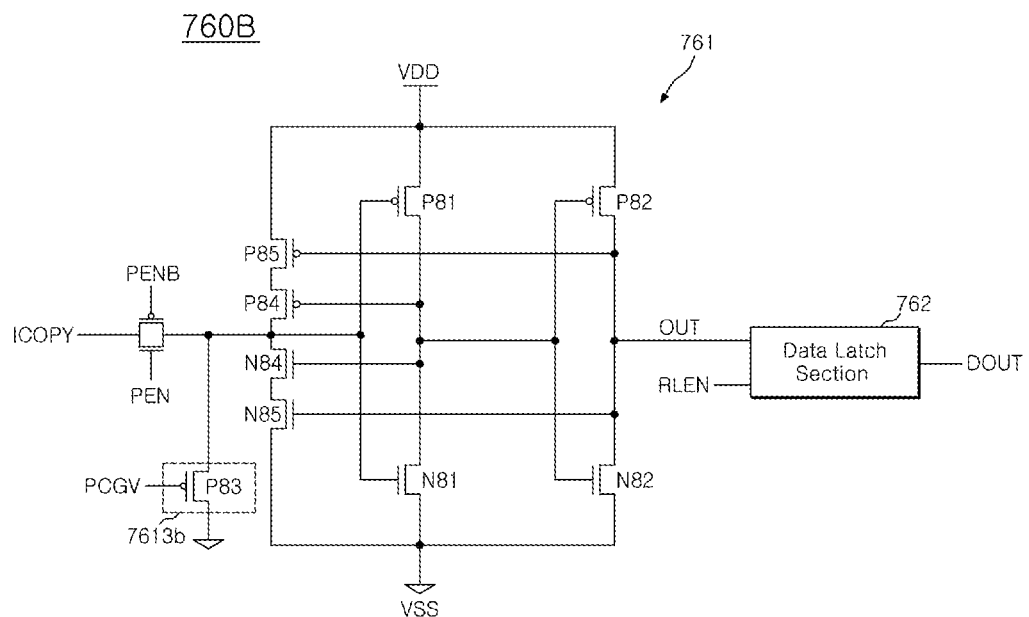

FIGS. 9A and 9B are views each showing the configuration of an embodiment of the output signal generation unit 760. In FIG. 9A, an output signal generation unit 760A may include a current amount sensing section 761 and a data latch section 762. The current amount sensing section 761 may be configured to sense the magnitude of the copied current ICOPY and generate an output signal OUT. The current amount sensing section 761 alters the transition time of the output signal OUT according to the magnitude of the copied current ICOPY. The data latch section 762 may be configured to latch the output signal OUT of the current amount sensing section 761 in response to a read enable signal RLEN and provide the data output signal DOUT.

In FIG. 9A, the current amount sensing section 761 may include a first inverter 7611 and a second inverter 7612. The first inverter 7611 may receive the copied current ICOPY. The driving time of the first inverter 7611 may be changed according to the magnitude of the copied current ICOPY. Namely, the first inverter 7611 may include a first PMOS transistor P81 and a first NMOS transistor N81. Since the turn-on times of the first PMOS transistor P81 and the first NMOS transistor N81 are changed according to the magnitude of the copied current ICOPY, the driving time of the first inverter 7611 may be changed. The second inverter 7612 may receive and invert the output of the first inverter 7611, and output a resultant signal. Like the first inverter 7611, the driving time of the second inverter 7612 may be changed according to the magnitude of the copied current ICOPY. The second inverter 7612 may include a second PMOS transistor P82 and a second NMOS transistor N82. The turn-on times of the second PMOS transistor P82 and the second NMOS transistor N82 are changed according to the output of the first inverter 7611. Accordingly, the first and second inverters 7611 and 7612 may alter the transition time of the level of the output signal OUT according to the magnitude of the copied current ICOPY.

The current amount sensing section 761 may further include a precharge part 7613a. The precharge part 7613a may be configured to precharge the input terminal of the first inverter 7611 is to a predetermined voltage level before the first inverter 7611 may receive the copied current ICOPY. In FIG. 9A, the precharge part 7613a may precharge the input terminal of the first inverter 7611 to the level of the ground voltage VSS in response to a precharge control signal PCGV. The precharge part 7613a may include a third NMOS transistor N83. The third NMOS transistor N83 may include a gate which may receive the precharge control signal PCGV, a drain which may be connected with the input terminal of the first inverter 7611 and a source which may be connected with the ground voltage VSS. Therefore, the precharge part 7613a provides the ground voltage VSS to the input terminal of the first inverter 7611 when the precharge control signal PCGV is enabled.

Accordingly, the current amount sensing section 761 may output the output signal of the low level by the precharge part 7613a before it may receive the copied current ICOPY. Thereafter, if the current amount sensing section 761 receives the copied current ICOPY, the transition time of the level of the output signal OUT may be altered according to the magnitude of the copied current ICOPY. That is to say, in the case where the magnitude of the copied current ICOPY is large, the output signal OUT quickly transitions to the high level, and in the case where the magnitude of the copied current ICOPY is small, the output signal OUT transitions to the high level slower than the case where the magnitude of the copied current ICOPY is large.

The current amount sensing section 761 may further include first and second leakage prevention parts 7614 and 7615. The first leakage prevention part 7614 may be configured to receive the outputs of the first and second inverters 7611 and 7612 and connect the terminal of the power supply voltage VDD and the input terminal of the first inverter 7611. The first leakage prevention part 7614 may include fourth and fifth PMOS transistors P84 and P85. The fourth PMOS transistor P84 has a gate which may be connected with the output terminal of the first inverter 7611 and a drain which may be connected with the input terminal of the first inverter 7611. The fifth PMOS transistor P85 has a gate which may be connected with the output terminal of the second inverter 7612, a source which may be connected with the terminal of the power supply voltage VDD and a drain which may be connected with the source of the fourth PMOS transistor P84. Accordingly, the fourth PMOS transistor P84 and the fifth PMOS transistor P85 may block the current applied from the terminal of the power supply voltage VDD to the input terminal of the first inverter 7611 and allow only the copied current ICOPY to be transferred to the first inverter 7611 in the case where the outputs of the first and second inverters 7611 and 7612 have low levels.

The second leakage prevention part 7615 may be configured to receive the outputs of the first and second inverters 7611 and 7612 and connect the terminal of the ground voltage VSS and the input terminal of the first inverter 7611. The second leakage prevention part 7615 may include fourth and fifth NMOS transistors N84 and N85. The fourth NMOS transistor N84 has a gate which may be connected with the output terminal of the first inverter 7611 and a drain which may be connected with the input terminal of the first inverter 7611. The fifth NMOS transistor N85 has a gate which may be connected with the output terminal of the second inverter 7612, a source which may be connected with the terminal of the ground voltage VSS and a drain which may be connected with the source of the fourth NMOS transistor N84. Accordingly, the fourth and fifth NMOS transistors N84 and N85 prevent the copied current ICOPY from being leaked to the ground voltage VSS and allow the copied current ICOPY to be precisely transferred to the first inverter 7611 in the case where the outputs of the first and second inverters 7611 and 7612 have high levels.

The current amount sensing section 761 may further include a current applying switch 7616. The current applying switch 7616 may transmit the copied current ICOPY to the first inverter 7611 in response to pass enable signals PEN and PENB. The current applying switch 7616 may transmit the copied current ICOPY to the first inverter 7611 when the pass enable signal PEN is enabled, and may block the copied current ICOPY from being transmitted to the first inverter 7611 when the pass enable signal PEN is disabled. The current applying switch 7616 may be provided to prevent the copied current ICOPY from being applied when the input terminal of the first inverter 7611 is precharged by the precharge part 7613a. Therefore, the pass enable signal PEN may be enabled when the input terminal of the first inverter 7611 is sufficiently precharged. If the pass enable signal PEN is enabled, the precharge control signal PCGV may be disabled. When the sensing operation of the semiconductor apparatus 4 is ended, that is, when a sensing enable signal SEN is disabled, the precharge control signal PCGV may be enabled.

The data latch section 762 latches the output signal OUT of the current amount sensing section 761 in response to the read enable signal RLEN and may generate the data output signal DOUT. The read enable signal RLEN may be configured to be enabled at an appropriate time, in consideration of the driving forces of the first and second inverters 7611 and 7612. Additionally, the read enable signal RLEN is generated within the pulse width of the pass enable signal PEN. The pulse width of the read enable signal RLEN may be set in such a manner that the read enable signal RLEN is enabled after the transition time of the level of the output signal OUT of the current amount sensing section 761 when the magnitude of the copied current ICOPY is large and is disabled before the transition time of the level of the output signal OUT of the current amount sensing section 761 when the magnitude of the copied current ICOPY is small.

FIG. 9B is a view showing the configuration of another embodiment of an output signal generation unit 760B. FIG. 9B is different from FIG. 9A only in terms of the configuration of a precharge part, and the other components of FIG. 9B are the same as those of FIG. 9A. In FIG. 9B, a precharge part 7613b may include a third PMOS transistor P83. The third PMOS transistor P83 has a gate which may receive the precharge control signal PCGV, a source which may be connected with the input terminal of the first inverter 7611 (see FIG. 9A) and a drain which may be connected with the ground voltage VSS. Accordingly, the third PMOS transistor P83 provides the ground voltage VSS to the input terminal of the first inverter 7611 in response to the precharge control signal PCGV. When the precharge part 7613b is constituted by the PMOS transistor P83, the ground voltage VSS is not directly provided to the input terminal of the first inverter 7611, and a voltage with a level higher by the threshold voltage of the third PMOS transistor P83 than the ground voltage VSS may be provided. In the case where the input terminal of the first inverter 7611 is precharged to the level higher by the threshold voltage of the third PMOS transistor P83 than the ground voltage VSS, the copied current sensing capability of the current amount sensing section 761 may be improved. In other words, the current amount sensing section 761 may quickly sense the copied current ICOPY, and the time at which the level of the output signal OUT of the current amount sensing section 761 transitions may be advanced.

FIG. 10 is a timing diagram explaining operations of the resistive memory apparatus 4 in accordance with an embodiment. Operations of the resistive memory apparatus 4 in accordance with an embodiment will be described with reference to FIGS. 8 to 10. First, in order to make an access to the data stored in a desired memory cell, a bit line select signal BLS and a word line select signal WLS are enabled. When the memory cell 720 is selected by the bit line select signal BLS and the word line select signal WLS, the sensing is enable signal SEN is enabled to sense the data stored in the memory cell 720, and the sensing voltage generation unit 710 provides a predetermined voltage to the sensing node VSAI. As the predetermined voltage is provided to the sensing node VSAI, the magnitude of current flowing through the sensing node VSAI may be changed according to the resistance value of the memory cell 720 (that is, according to the value of the data stored in the memory cell 720). A change in the amount of current results in a change in the voltage level of a comparison signal COM, and the current copy unit 750 may generate the copied current ICOPY in response to the change in the voltage level of the comparison signal COM. When the resistance of the memory cell 720 is large, the magnitude of the copied current ICOPY decreases, and when the resistance of the memory cell 720 is small, the magnitude of the copied current ICOPY increases.

Thereafter, when the pass enable signal PEN is enabled, the current applying switch 7616 applies the copied current ICOPY to the current amount sensing section 761 in response to the pass enable signal PEN. The current amount sensing section 761 may receive the copied current ICOPY and determines the transition time of the level of the output signal OUT according to the magnitude of the copied current ICOPY. In the case where the magnitude of the copied current ICOPY is large, the output signal OUT of the current amount sensing section 761 quickly transitions to a high level. The data latch section 762 may latch the output signal OUT of the current amount is sensing section 761 with the high level in response to the read enable signal RLEN and generate the data output signal DOUT. Conversely, in the case where the magnitude of the copied current ICOPY is small, the output signal OUT of the current amount sensing section 761 slowly transitions to the high level. The data latch section 762 latches the output signal OUT of the current amount sensing section 761 in response to the read enable signal RLEN. Since the output signal OUT of the current amount sensing section 761 slowly transitions to the high level, the data latch section 762 latches the output signal OUT of the current amount sensing section 761 which has a low level. Accordingly, the data latch section 762 may generate the data output signal DOUT with the low level.

While various embodiments have been described above, it will be understood to those skilled in the art that the embodiments described are by way of example only. Accordingly, the resistive memory apparatus described herein should not be limited based on the described embodiments.

What is claimed is:

1. A resistive memory apparatus comprising:
a sensing voltage generation unit configured to drive a sensing node to a voltage with a predetermined level in response to a reference voltage and a voltage of the sensing node;
a memory cell connected with the sensing node and configured to generate sensing current according to a resistance value thereof; and
an output signal generation unit configured to sense a magnitude of copied current generated by copying the sensing current, and generate a data output signal,
wherein the output signal generation unit comprises:
a current amount sensing section configured to sense the magnitude of the copied current and generate an output signal; and
a data latch section configured to latch the output signal of the current amount sensing section in response to a read enable signal and generate the data output signal,
wherein the current amount sensing section alters a transition time of a level of the output signal according to the magnitude of the copied current.

2. The resistive memory apparatus according to claim 1, wherein the sensing voltage generation unit comprises:
a comparator configured to compare a level of the reference voltage and a voltage level of the sensing node and generate a comparison signal; and
a driver section configured to provide a power supply voltage to the sensing node in response to the comparison signal.

3. The resistive memory apparatus according to claim 2, wherein the driver section comprises a MOS transistor having a gate which receives the comparison signal and a drain and a source any one of which is applied with the power supply voltage and the other of which is connected with the sensing node.

4. The resistive memory apparatus according to claim 3, further comprising:
a current copy unit configured to generate copied current which has substantially the same magnitude as the sensing current, in response to the comparison signal.

5. The resistive memory apparatus according to claim 4, wherein the current copy unit comprises a MOS transistor having a gate which receives the comparison signal and a drain and a source any one of which is applied with the power supply voltage and the other of which outputs the copied current.

6. The resistive memory apparatus according to claim 1, wherein the current amount sensing section comprises:
a first inverter configured to be driven by receiving the copied current;
a second inverter configured to be driven by receiving an output of the first inverter;
a first leakage prevention part configured to receive outputs of the first and second inverters and control connection of a terminal of the power supply voltage and an input terminal of the first inverter; and
a second leakage prevention part configured to receive the outputs of the first and second inverters and control connection of a terminal of a ground voltage and the input terminal of the first inverter.

7. The resistive memory apparatus according to claim 6, wherein the current amount sensing section comprises:
a precharge part configured to precharge the input terminal of the first inverter to a predetermined voltage level before receiving the copied current.

8. The resistive memory apparatus according to claim 6, wherein the current amount sensing section comprises:
a current applying switch configured to determine a time for applying the copied current to the first inverter, in response to a pass enable signal.

* * * * *